United States Patent
Schmotzer (10) Patent No.: US 12,297,533 B2
(45) Date of Patent: May 13, 2025

(54) LIQUID PRECURSOR VAPOR PRESSURE CONTROL

(71) Applicant: ASM IP Holding B.V., Almere (NL)

(72) Inventor: Michael Schmotzer, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 327 days.

(21) Appl. No.: 17/847,306

(22) Filed: Jun. 23, 2022

(65) Prior Publication Data

US 2022/0411925 A1 Dec. 29, 2022

Related U.S. Application Data (60) Provisional application No. 63/215,662, filed on Jun. 28, 2021.

(51) Int. Cl.
 *C23C 16/448* (2006.01)
 *B01J 7/00* (2006.01)

(52) U.S. Cl.
 CPC ............. *C23C 16/4481* (2013.01); *B01J 7/00* (2013.01); *B01J 2219/00094* (2013.01); *B01J 2219/00146* (2013.01)

(58) Field of Classification Search
 CPC ... C23C 16/4481; C23C 16/45561; B01J 7/00
 See application file for complete search history.

(56) References Cited

U.S. PATENT DOCUMENTS

| | | | |
|---|---|---|---|
| 6,220,091 B1 * | 4/2001 | Chen | C23C 16/4482 73/302 |
| 7,531,065 B2 | 5/2009 | Yamamoto | |
| 2006/0133955 A1 * | 6/2006 | Peters | C23C 16/4481 422/63 |
| 2008/0178809 A1 | 7/2008 | Spohn | |
| 2009/0017207 A1 * | 1/2009 | Eser | C23C 14/562 427/251 |
| 2010/0154710 A1 * | 6/2010 | Priddy | C23C 14/26 118/724 |
| 2015/0053134 A1 * | 2/2015 | Lee | C23C 16/45512 366/101 |

FOREIGN PATENT DOCUMENTS

WO 2006101767 A2 9/2006

* cited by examiner

Primary Examiner — Joseph A Miller, Jr.
(74) Attorney, Agent, or Firm — Snell & Wilmer L.L.P.

(57) ABSTRACT

A source vessel for use in a semiconductor processing system to supply precursor materials by providing enhanced control over vapor pressures. The source vessel includes a housing or vessel defining a chamber for holding a volume of precursor in a liquid state. The source vessel further includes a temperature sensor configured to detect a temperature of a surface of the liquid-state precursor that is presently contained within the chamber of the housing. The temperature sensor may take the form of a temperature measurement device such as a thermocouple on a float or a non-contact temperature measurement device such as an infrared (IR) temperature sensor with a line-of-sight to the liquid's surface.

13 Claims, 6 Drawing Sheets

LIQUID PRECURSOR VAPOR PRESSURE CONTROL

CROSS-REFERENCE TO RELATED APPLICATIONS

This application is a non-provisional of, and claims priority to and the benefit of, U.S. Provisional Patent Application No. 63/215,662, filed Jun. 28, 2021 and entitled "LIQUID PRECURSOR VAPOR PRESSURE CONTROL," which is hereby incorporated by reference herein.

FIELD OF THE DISCLOSURE

The present disclosure relates generally to vessels for containing a liquid chemical to be dispensed as a vapor phase reactant for a semiconductor processing or reactor system, and more particularly to temperature and vapor pressure control within liquid precursor vessels.

BACKGROUND OF THE DISCLOSURE

Semiconductor processing and manufacturing systems commonly use one or more vapor phase reactants, e.g., precursors, as source chemicals for performing semiconductor substrate processes, such as, for example, deposition, cleaning, and etching processes. The vapor phase reactants may be contained in a source vessel in a liquid state and are subsequently converted to a vapor state for transport to a reaction chamber associated with a semiconductor processing apparatus. The controlled conversion to the vapor state requires accurate control over the vapor pressure (VP) within the source vessel, and this may be achieved, in part, by controlling the surface temperature of the vapor phase reactant liquid contained in the vessel as a change in surface temperature will change the vapor pressure of the vapor phase reactant or precursor.

Conventional temperature sensors, such as thermocouples mounted within the source vessel, may not provide sufficiently accurate temperature readings. This problem may be further exacerbated as source vessels increase in size to allow more liquid to be stored before having to re-charge the source vessels. For example, a conventional source vessel used to provide temperature readings will utilize a thermocouple positioned near the bottom of the vessel. However, temperature readings from a fixed thermocouple immersed within a liquid chemical in a source vessel may not accurately represent the surface temperature of the contained liquid.

Further, to prevent condensation in the source vessel, the source vessel may be configured to use an overall heat control methodology that targets a temperature gradient from the top to the bottom of the vessel, and this requires a higher temperature at the top versus the bottom of the vessel. The difficulty of obtaining an accurate temperature of the liquid in the source vessel may be increased by changing liquid levels because an enforced temperature gradient will likely change with changing liquid levels, which often results in undesirable changes in liquid surface temperatures.

Because the surface temperature affects the vapor pressure of the precursor in the source vessel (especially for high vapor pressure precursors such as trimethylaluminum (TMA), water ($H_2O$), titanium tetrachloride ($TiCl_4$), and the like), these inaccurate temperature measurements may adversely affect semiconductor processing.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Disclosed herein, according to various embodiments, is a source vessel or source vessel assembly configured to provide enhanced liquid precursor vapor pressure (VP) control within a semiconductor processing system. The source vessel is designed to provide a modified, when compared with conventional techniques, method for measuring and controlling temperature of liquid precursors in the source vessel. By measuring and controlling the surface temperature of the liquid precursor, the source vessel can be operated so as to cause the vapor pressure to remain constant (e.g., within a predefined range) regardless of the liquid level. This may involve creating and maintaining a temperature gradient in the liquid precursor in the source vessel to ensure there are higher temperatures at the top versus the bottom to limit condensation.

In some exemplary embodiments, a source vessel is provided for use in a semiconductor processing system. The source vessel (or source vessel assembly) includes a housing (or vessel body) defining a chamber for holding a volume of precursor in a liquid state (or "liquid-state precursor"). The source vessel further includes a temperature sensor configured to detect a temperature of a surface of the liquid-state precursor that is presently contained within the chamber of the housing.

The temperature sensor may be provided as a floating temperature measurement device or assembly that is configured to float on the surface of the liquid-state precursor. To this end, the temperature measurement device may include a body or float element formed of a material that is buoyant in the precursor and a temperature sensor such as a thermocouple may be mounted upon or supported by the body or float element. The source vessel may further include a vertical guidance rod or shaft that is vertically disposed within the chamber of the housing, and the body or float element may be adapted to slidingly engage with or be movably coupled to the vertical guidance rod such that the floating temperature measurement device floats upon the precursor surface while being guided to move along the guidance rod in response to liquid level changes of the precursor in the chamber. To this end, the body or float element may be ring shaped with the guidance rod extending through a center opening or hole in the body or float element.

Alternatively, the temperature sensor may take the form of a non-contact temperature measurement device such as an infrared (IR) temperature sensor mounted within the housing or on or in a wall of the housing with a line-of-sight to the surface of the liquid precursor contained in the chamber. In some cases, the temperature sensor is provided as an array of temperature measurement devices, such as thermocouples, on a vertical support or on the housing inner surface arranged and operated to sense or detect a bottom temperature (or temperature of the liquid-state precursor at a lowest point of the chamber in the housing), a top surface temperature, and a plurality of intermediate temperatures at locations between the top surface of the liquid-state precursor and the bottom of the chamber. These temperature sensors may be uniformly vertically distributed in the chamber or may be nonuniformly vertically distributed with the intervals or spacing between adjacent pairs of the temperature sensors growing smaller and smaller (or simply being smaller) from the top to the bottom of the housing.

In such cases, the source vessel assembly may also include a liquid-level sensing system for detecting a level of the liquid-state precursor within the chamber, and this level may be used by a controller (which may also process outputs of the liquid-level sensing system) to select one of the temperature measurement devices as providing a temperature measurement of the surface of the liquid-state precursor at a particular time to account for changes in liquid levels in the chamber.

In some implementations, a heating jacket or other heater is disposed around circumferential exterior sides of the housing, and the heater or heating jacket is controlled by a controller (provided as part of the source vessel assembly or as part of the semiconductor processing system) to operate so as to heat the housing (or its sidewalls configured to define a cylindrical chamber in some cases) and the liquid-state precursor contained therein. To achieve a desired temperature gradient in the chamber of the housing (and the liquid-state precursor contained therein), a heat sink may be disposed on or in abutting contact with a bottom side or wall of the housing to remove a desired amount of heat at a desired rate from the lower portions of the liquid-state precursor.

In other embodiments, a semiconductor processing system is provided that is operable to provide accurate surface temperature readings for liquid-state precursors and for maintaining a desired surface temperature and vapor pressure during processing of a semiconductor product/wafer. The system may include a source vessel (or source vessel assembly) including a temperature sensor configured to detect a temperature of an upper or top surface of a liquid-state precursor contained within the source vessel. The system may also include a heating jacket disposed around the source vessel and a controller. The controller may include a processor configured to communicate with or access a tangible, non-transitory memory, which has instructions or code (e.g., a source vessel control program or module) stored therein, that, in response to execution by the processor, cause the semiconductor processing system to perform various operations or functions. These operations may include: (a) receiving, by the processor, temperature data from the temperature sensor indicative of the temperature of the surface of the liquid-state precursor; and (b) based on the temperature of the surface, controlling, by the processor, the heating jacket to heat the liquid-state precursor to impart a desired vapor pressure to the liquid-state precursor (or to maintain a desired VP within the source vessel).

In the semiconductor processing system, the temperature sensor may be a floating temperature measurement device configured to float on the surface of the liquid-state precursor. In such implementations, the source vessel further may include a vertical guidance rod vertically disposed within the source vessel, and the floating temperature measurement device may be designed to be moveably coupled to the vertical guidance rod such that the floating temperature measurement device move vertically up and down along the guidance rod in response to liquid level changes of the liquid-state precursor. In other cases, the temperature sensor may include one or more infrared temperature sensors. In still other implementations, the temperature sensor may take the form of a plurality of temperature sensors vertically distributed within the source vessel.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As described in greater detail below, various details and embodiments of the disclosure may be utilized in conjunction with a reaction chamber configured for a multitude of deposition processes, including but not limited to, ALD, CVD, metalorganic chemical vapor deposition (MOCVD), molecular beam epitaxy (MBE), physical vapor deposition (PVD), plasma-enhanced chemical vapor deposition (PECVD), and plasma etching. The embodiments of the disclosure may also be utilized in semiconductor processing systems configured for processing a substrate with a reactive precursor, which may also include etch processes, such as, for example, reactive ion etching (ME), capacitively coupled plasma etching (CCP), and electron cyclotron resonance etching (ECR).

In many of these semiconductor processing systems, a source vessel is used to hold a volume of precursor material in its liquid state and at a desired vapor pressure to allow the precursor to be fed into a deposition or reaction chamber as needed. The source vessel was heated and heat was removed via a heat sink on a lower vessel surface to try to control vapor pressure in the source vessel. Prior to the concepts taught herein, a thermocouple that was immersed in the liquid-state precursor near the bottom of the source vessel and, therefore, bottom of the stored precursor was used to measure precursor temperatures and, in turn, to control the heater to control vapor pressure.

The inventor recognized that measuring temperature near the bottom (or bulk0 of liquid may not accurately represent the surface temperature of the liquid-state precursor. This deficiency is significant because, to prevent condensation it is desirable to provide a heat control methodology that provides a temperature gradient from top to bottom of the vessel (e.g., higher temperatures at top of the vessel and lower temperatures at the bottom of the vessel). However, as liquid level changes during system operations (e.g., during use of the precursor material)), the enforced temperature gradient may change the liquid surface temperature, and a changing surface temperature will result in a changing vapor pressure of the precursor, especially for high vapor pressure precursors (such as trimethylaluminum (TMA), water ($H_2O$), titanium tetrachloride ($TiCl_4$), and the like).

In one example, an existing source vessel was designed to provide a temperature gradient in a vessel ranging from 45° C. at the top to 42° C. in the middle to 35° C. (e.g., at or near a control temperature for a particular gradient) at the bottom of the vessel. During the use, the liquid surface may be at or near 45° C. when near the top of the vessel (e.g., at 43° C.) with a first vapor pressure (e.g., $H_2O$ with VP of approximately 64.8 torr) but at a much lower temperature when near the bottom of the vessel (e.g., at 36° C.) with a second (often much lower) vapor pressure (e.g., $H_2O$ with VP of approximate 44.6 torr). In response to this issue, the inventor determined there was a need for a source vessel design with the ability to measure and control surface temperature of a liquid-state precursor rather than the bulk temperature as was the case with earlier designs.

Figure 1:
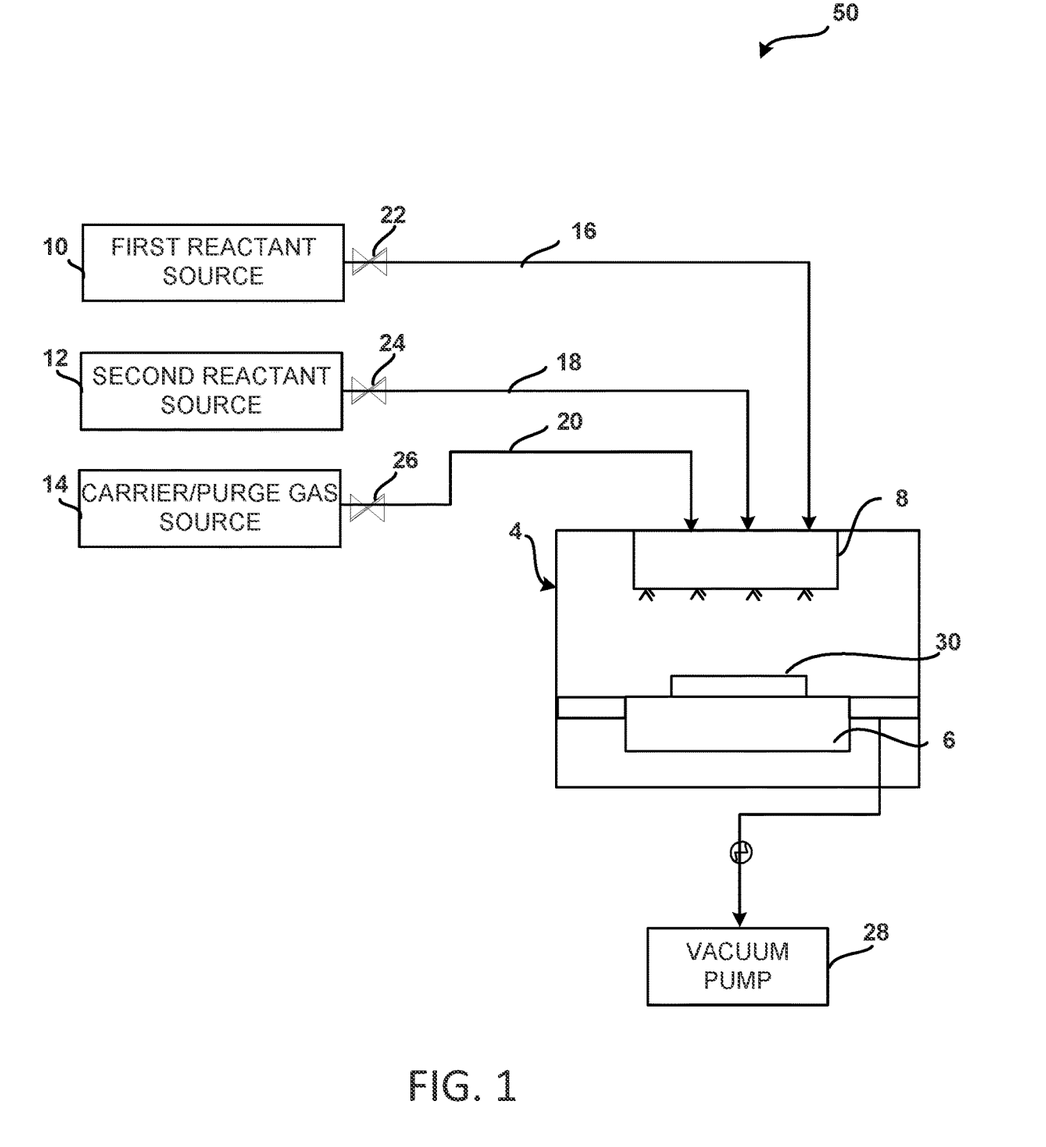
FIG. 1 is a functional block diagram or schematic of a semiconductor processing system that may be configured to include the liquid precursor vapor pressure control of the present description.

Reactor or semiconductor processing systems used for ALD, CVD, and/or the like, may be used for a variety of applications, including depositing and etching materials on a substrate surface. In various embodiments, with reference to FIG. 1, a reactor or semiconductor processing system 50 may comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20 and valves or controllers 22-26. System 50 may also comprise a vacuum source 28 fluidly coupled to the reaction chamber 4.

Figure 2A:
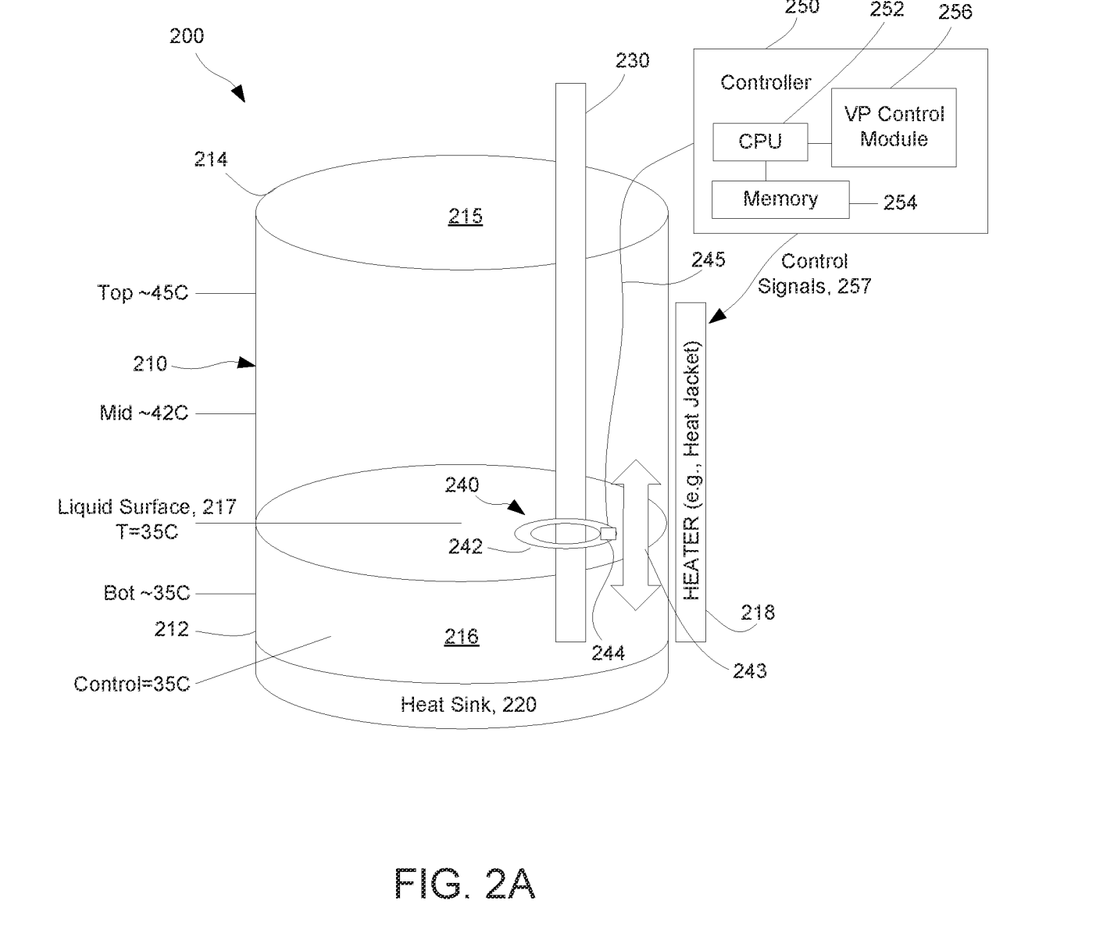
FIGS. 2A and 2B illustrate schematically a source vessel assembly of the present description, while in two different operational states, that includes a floating temperature sensor for use in measuring and controlling surface temperatures of liquid precursors.
Figure 2B:
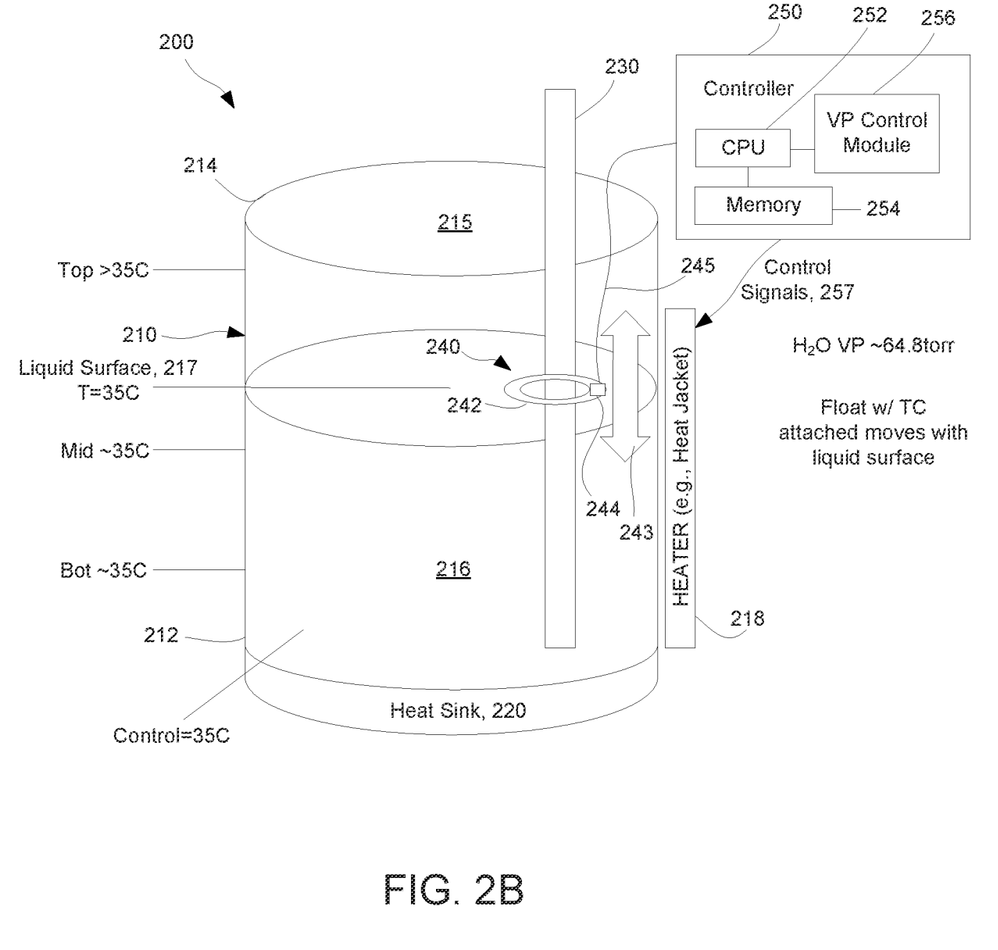
Figure 3A:
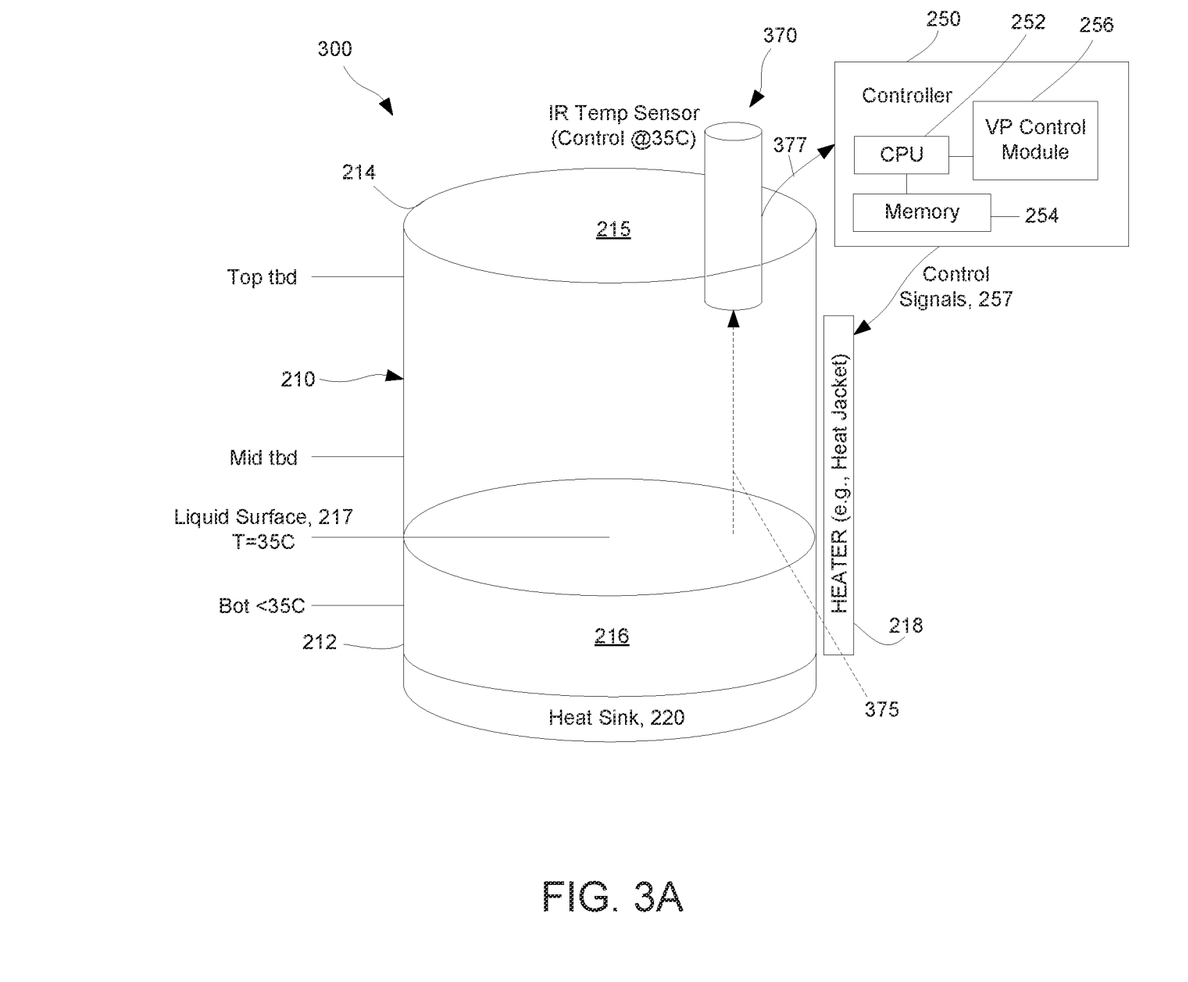
FIGS. 3A and 3B illustrate a source vessel similar to that of FIGS. 2A and 2B except for the use of a fixed position, non-contact temperature measurement device in place of the floating temperature sensor.
Figure 3B:
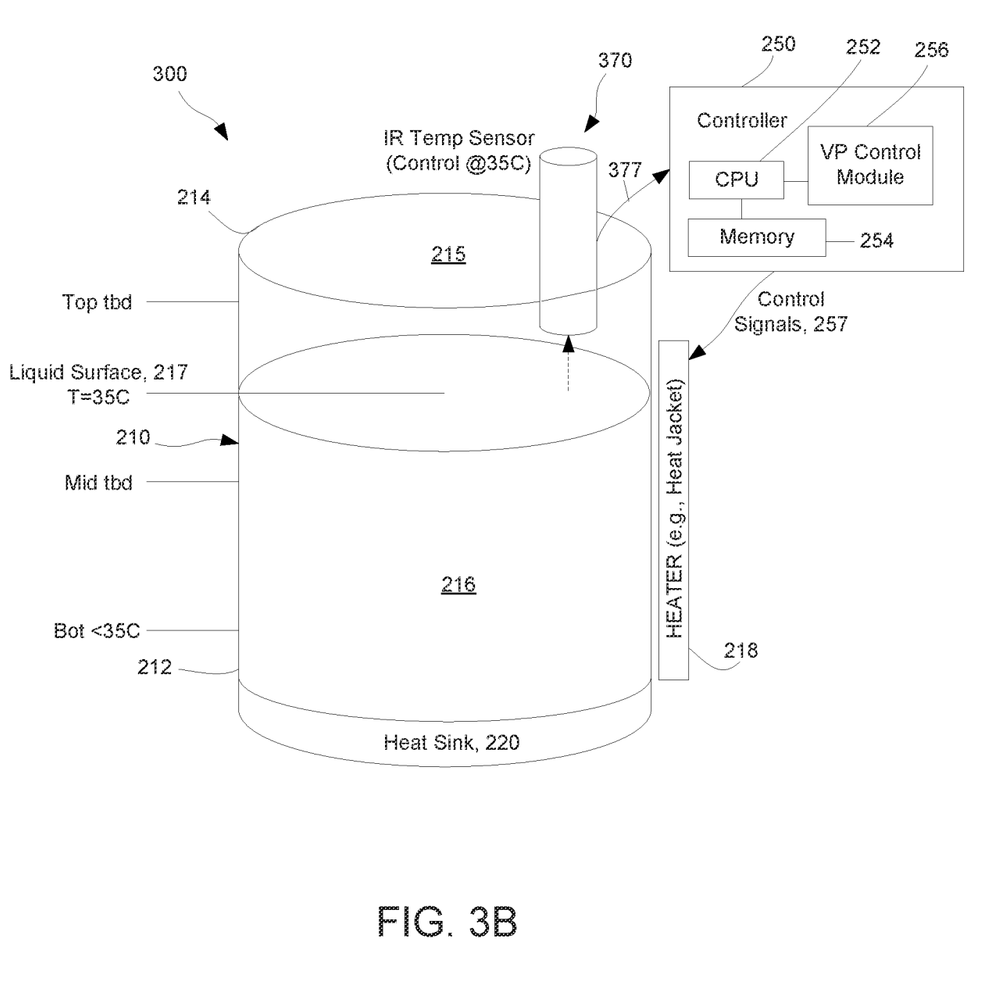
Figure 4:
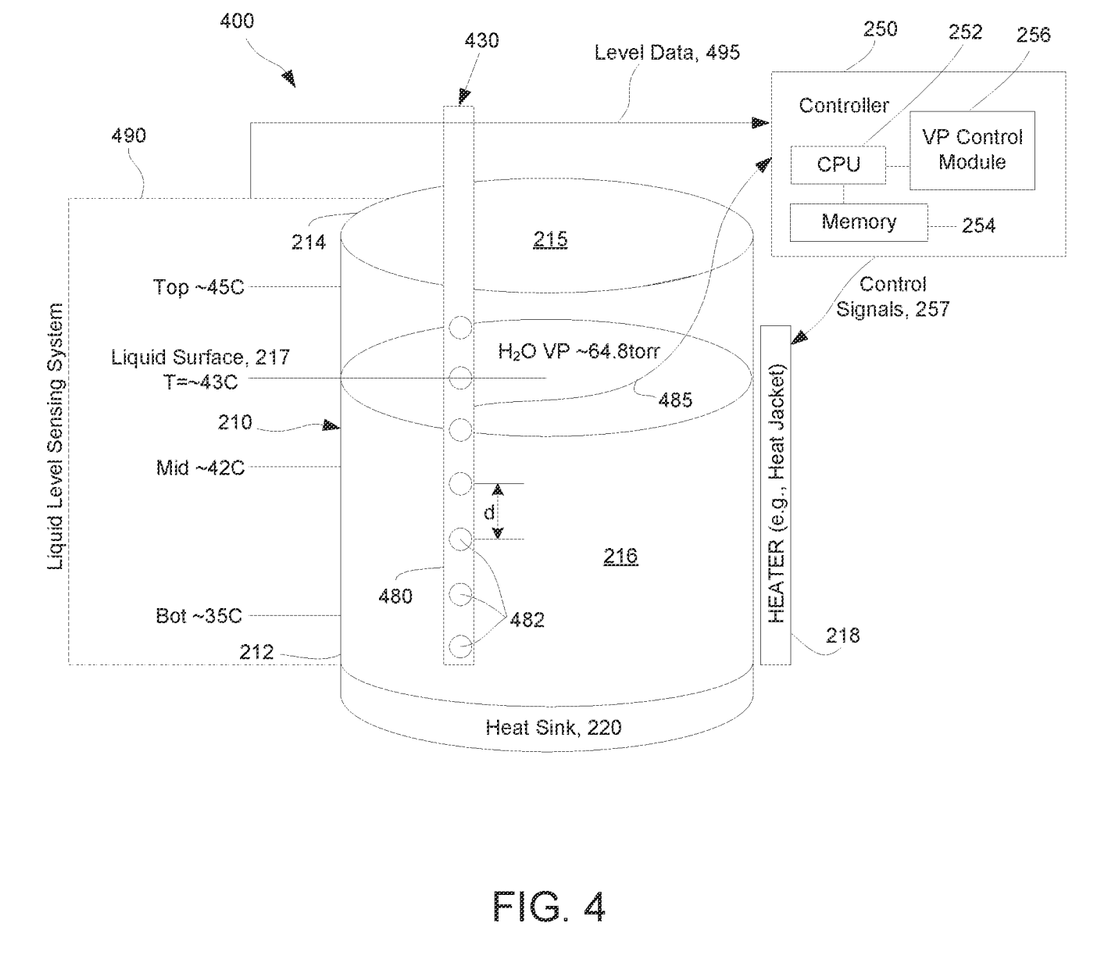
FIG. 4 illustrates a source vessel similar to those shown in FIGS. 2A-3B except for the use of an array of contact-type temperature measurement devices arranged vertically in the chamber of the housing or vessel for measuring surface temperatures of a liquid-state precursor.

The first or second reactant source 10 or 12 may be configured for providing a precursor to the reaction chamber 4, and, as discussed above, such feeding of the precursor to the chamber 4 is controlled or facilitated in part by controlling the vapor pressure of the liquid-state precursor in the source 10 or 12. Vapor pressure, in turn, may vary with the surface temperature of the liquid-state precursor, and it is desirable to accurately measure and control the surface temperature of source liquids within these sources or source vessels 10 or 12. To this end, the inventor has created source vessel or source vessel assembly designs that use: (1) a floating temperature sensor (e.g., a thermocouple on a float element) as shown in FIGS. 2A and 2B; (2) an infrared (IR) temperature sensor mounted in an upper wall, cap, or lid of the housing defining the liquid-receiving chamber as shown in FIGS. 3A and 3B; and (3) a column/series of thermocouples or other temperature measurement devices extending vertically in a source vessel in conjunction with a liquid level sensor to more accurately target surface temperature measurements as shown in FIG. 4.

FIGS. 2A and 2B illustrate schematically a source vessel assembly 200 of the present description, while in two different operational states, that includes a floating temperature sensor 240 for use in measuring and controlling temperatures of an upper surface (or simply "surface temperatures") of liquid or liquid-state precursor. As shown, the assembly 200 includes a housing or vessel 210 with sidewalls extending from a lower end or bottom 212 to an upper end or top 214, and the housing 210, in this non-limiting example, defines an interior space or chamber 215 that is cylindrical in shape. The housing 210 is shown to be transparent and with an open top for ease of explanation but typically would be capped or covered and be formed of a nontransparent material to provide a useful pressure vessel as is well-known in the arts. The assembly 200 may take the place of source 10 or source 12 in the system 50 of FIG. 1 and be used to provide a precursor. To this end, a volume of liquid precursor 216 (or liquid-state precursor) is shown to be received in the chamber 215 of the housing 210 and to have a surface 217 that may vary during use of the assembly 200.

A heater (e.g., a heat jacket) 218 is shown in the assembly 200 that is used to heat the sidewalls of the housing 210 and, hence, the liquid-state precursor 216, and the heater 218 typically would extend circumferentially around the housing 210 and extend from the bottom 212 to the top 214 of the housing 210. A controller 250 is provided in the assembly 200 (or in the system 50 of FIG. 1) that includes a processor 252 that accesses memory 254 and executes code or instructions (which may be stored in memory 254) to provide the functions or operations of a VP control module 256. These functions include generating control signals 257 to operate the heater 218 to heat the housing 210 to achieve a desired temperature of the liquid surface 217 and, hence, a desired vapor pressure for the precursor 216. A heat sink 220 is provided on or in abutting contact with the bottom or lower side 212 of the housing/vessel 210 to remove heat from the housing 210 and create a temperature gradient from the bottom 212 to the top 214 of the housing 210 (with lower temperatures at the bottom of the housing/vessel 210 to control condensation).

To measure a temperature of the liquid surface 217, the assembly 200 further includes a temperature sensor (or temperature sensor assembly) 240. The temperature sensor 240 is a contact-type sensor and is designed to float on the surface 217 so as to move up and down as shown with arrow 243 with the surface 217 as the volume of precursor 216 varies over time in operations of the assembly 200. To this end, the temperature sensor 240 includes a body or float element 242 that is fabricated of material that is buoyant in the precursor material, and a contact-type temperature measurement device 244, such as a thermocouple, is attached on or in the body/float element 242 so that the device 244 remains in contact with or submerged in a volume of the precursor material at the liquid surface 217.

To control the movement of the temperature sensor 240 on the surface 217, a vertical guidance rod or shaft 230 may optionally be provided, and the body or float element 242 may be configured to slidingly or movable engage or couple with the exterior surfaces of the rod 230 (e.g., by providing a centrally-located hole/opening in the body 242 that is ring or annulus-shaped and placed over the rod 230 as shown that is larger than the outer diameter or dimensions of the rod 230 and which may be similarly shaped (e.g., both circular in cross section)) to remain in a relatively constant horizontal position on the surface 217 as it moves up and down 243 with changing liquid levels in the chamber 215. In other embodiments, other designs may be used to control the location of the body 242 during movements of temperature measurement device 244 such as with a pivotal arm (which is fixed on an end opposite the body 242) replacing the vertical guidance rod 230. The body/float element 242 may be fabricated of a buoyant and corrosive-resistant material (such as a plastic body that may be solid or hollow) with adequate mass to support the temperature sensor device 244.

The temperature measurement device 244 may be wirelessly coupled to or coupled in a wired manner (as shown with line 245) to the controller 250 and operate to communicate sensed or detected temperature data for the surface 217. This data may be stored in memory 254 and processed by the VP control module 256 to determine whether or not the temperature of the liquid surface 217 is within a desired and predefined range to achieve a desired vapor pressure for precursor 216 (for delivery of this material to a reaction chamber as discussed for system 50 of FIG. 1). In response, the VP control module 256 may generate control signals 257 that are communicated by the controller to the heater 218 to cause it to operate to heat the housing 210 and retain a desired temperature of the surface 217 and/or a desired temperature gradient in the housing 210 or on its sidewalls.

FIGS. 2A and 2B illustrate the assembly 200 operating in two differing states related to two differing liquid levels for the precursor 216. In both operating states, the control temperature for the bottom 212 of the housing is set to 35° C. As shown in FIG. 2A, with this setting and operation of the heater 218 and with the liquid surface 217 being some distance below a midpoint between the bottom 212 and top 214 of the housing 210, the liquid surface 217 has a temperature matching that of the control temperature. This is achieved, via control signals 257 to heater 218, with a temperature gradient for the housing 210 with the top 214 being 45° C. and a midpoint being at 42° C.

Likewise, though, when the liquid level or surface 217 moves above the midpoint toward the top 214 of the housing as shown in FIG. 2B, a measurement of the temperature by the floating sensor 240 can be used by the controller 250 to operate the heater 218 via signals 257 to achieve a different temperature gradient in the housing 210 (with the midpoint of the housing 210 at about 35° C. and the top at some temperature over 35° C. to retain the surface temperature 217 at the control temperature of 35° C.). In this manner, the vapor pressure is controlled to be the same or within an acceptable predefined range in both operating states (e.g., a VP of about 64.8 torr when the precursor is $H_2O$).

FIGS. 3A and 3B illustrate a source vessel assembly 300 similar to that of FIGS. 2A and 2B except for the use of a fixed position, non-contact temperature measurement device 370 in place of the floating temperature sensor. Like components used in both assembly 200 and 300 are numbered and may have the form and operational characteristics discussed above, and, likewise, the assembly 300 may be operated in two states corresponding with two liquid levels for the liquid-state precursor 216 while maintaining a constant or relatively constant liquid surface temperature (and, hence, VP).

As shown, a temperature sensor 370 is used in assembly 300, and this may take the form of a temperature measurement device in the form of an IR temperature sensor or other non-contact temperature sensor. The temperature sensor 370 is mounted in or near the housing 210, such as on or within a housing cap or lid (not shown) with a clear sight line as shown with dashed line 375 for sensing or detecting (such as with transmission of an IR beam that is reflected from the top surface 217) a temperature of the liquid surface 217 of the liquid-state precursor 216 even as it moves up and down between the two operating states (and between such states and levels) as shown in FIGS. 3A and 3B.

The non-contact temperature sensor 370 functions to transmit temperature data as shown with arrow 377 related to the temperature of the liquid surface 217 (in a wireless manner as shown or via a wired coupling) to the controller 250, which responds as discussed above, by determining the liquid surface temperature and responding, as needed, to generate control signals 257 to operate the heater 218 to maintain the temperature of the liquid precursor 216 at its surface 217 within a predefined range about the control temperature.

FIG. 4 illustrates a source vessel assembly 400 similar to those shown in FIGS. 2A-3B except for the use of an array 480 of a plurality of contact-type temperature measurement devices 482 arranged vertically in the chamber of the housing or vessel for measuring surface temperatures of the liquid-state precursor 216. Only one operating state is shown, but, from FIGS. 2A-3B, it will be understood that the surface 217 varies in height within the housing 210 during use of the assembly 400, with the assembly 400 being configured to accurately measure the temperature of the precursor 216 at surface 217.

To this end, the temperature sensor takes the form of an array 480 of contact-type temperature measurement devices 482 (e.g., thermocouples or the like). Each of the devices 482 is mounted on an external surface of a vertical support 430 positioned in the chamber 215 of the housing 210, while some embodiments may mount the devices 482 of the array 480 directly upon an inner surface of the housing 210. In this way, each device 482 can have its sensing surface(s) exposed to the liquid precursor 216. The vertical support 430, and the mounted array 480, extends from the bottom 212 to the top 214 of the housing 210 and the number of devices 482 is large enough (when combined with the spacing, d, between adjacent ones of the devices 482) such that one of the devices 482 is proximate (e.g., within 0.5 inches or the like) to the surface 217 regardless of its present location within the chamber 215.

A liquid level sensing system 490 is included in the assembly 400 and is operable to sense the location of the liquid surface 217 within the chamber 215 or to collect data that can be processed by the controller 250 (e.g., with its VP control module 256 or other software) to determine the location of the liquid surface 217. The determined level or level data 495 is communicated in a wireless or wired manner (as shown with arrow 485) to the controller 250. The level sensing system 490 may take a variety of forms to practice the assembly 400, with one embodiment using a level sensing apparatus as shown in U.S. patent application Ser. No. 16/108,950, which is incorporated herein in its entirety.

The controller 250 uses the determined location of the surface 217 of the liquid-state precursor 216 to select the most appropriate temperature measurement device 482 in the array for providing temperature data for the surface 217 at a particular operating state of the assembly 400 (e.g., by selecting the device 482 that is closest in height to the surface 217 while being adequately in contact or submerged under the precursor 216 to obtain a useful temperature measurement). The spacing, d, may be uniform along the length of the support element 430 (as shown) or may be non-uniform with smaller spacings being provided between adjacent ones of the devices 482 in the array 480 at locations nearer to the bottom 212 of the housing 210 (e.g., where there may be less height or space for achieving a desired temperature gradient such as with lower liquid levels).

As discussed above, heating may be provided by a heating jacket surrounding circumferential sides (and optionally the top side) of the housing or vessel. A heat sink is preferably included in each source vessel assembly such on the bottom of the housing or vessel to dissipate heat and purposefully generate a heat gradient through the liquid-state precursor, e.g., colder at bottom and hotter at liquid surface. The controlled and purposeful temperature gradient prevents hotspots and allows for better control of surface temperature. To this end, the heat jacket delivers heat to liquid while the bottom heat sink pulls heat out of the system, forcing a temperature gradient. The source vessel assemblies described herein may include a fixed thermocouple at the bottom of the housing or vessel to assist in measuring and achieving the temperature gradient. The heat sink may include fins or other heat transfer features, increasing surface area of heat sink material, thereby increasing convective heat transfer capability.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke a means-plus-function limitation unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A source vessel for a semiconductor processing system, the source vessel comprising:
   a housing defining a chamber for holding a liquid-state precursor; and
   a temperature sensor configured to detect a temperature of a surface of the liquid-state precursor contained within the chamber of the housing; wherein:
   the temperature sensor is a floating temperature measurement device configured to float on the surface of the liquid-state precursor; and
   the source vessel further comprises a vertical guidance rod vertically disposed within the chamber of the housing, wherein the floating temperature measurement device is moveably coupled to the vertical guidance rod such that the floating temperature measurement device is configured to move along the guidance rod in response to liquid level changes of the liquid-state precursor.

2. The source vessel of claim 1, wherein the floating temperature measurement device comprises a buoyant material.

3. The source vessel of claim 1, wherein the floating temperature measurement device comprises a ring shape, wherein the vertical guidance rod extends through the ring shape of the floating temperature measurement device.

4. The source vessel of claim 1, further comprising a heating jacket disposed around circumferential sides of the housing, wherein the heating jacket is configured to heat the housing and the liquid-state precursor contained therein.

5. The source vessel of claim 4, further comprising a heat sink disposed at a bottom side of the housing.

6. The source vessel of claim 5, further comprising a temperature measurement device coupled to the bottom side of the housing for detecting a bottom temperature of the liquid-state precursor.

7. The source vessel of claim 1, wherein the temperature sensor comprises an infrared temperature sensor.

8. A source vessel for a semiconductor processing system, the source vessel comprising:
   a housing defining a chamber for holding a liquid-state precursor;
   a liquid-level sensing system configured to detect a level of the liquid-state precursor within the chamber; and
   a plurality of temperature sensors distributed vertically within the chamber, wherein the plurality of temperature sensors is nonuniformly vertically distributed within the chamber, with intervals between adjacent temperature sensors near a bottom portion of the source vessel being smaller than intervals between adjacent temperature sensors near a top portion of the source vessel.

9. The source vessel of claim 8, further comprising a heating jacket disposed around circumferential sides of the housing, wherein the heating jacket is configured to heat the housing and the liquid-state precursor contained therein.

10. The source vessel of claim 9, further comprising a heat sink disposed at a bottom side of the housing.

11. The source vessel of claim 10, further comprising a temperature measurement device coupled to the bottom side of the housing for detecting a bottom temperature of the liquid-state precursor.

12. A semiconductor processing system comprising:
   a source vessel comprising:
      a housing defining a chamber for holding a liquid-state precursor;
      a liquid-level sensing system configured to detect a level of the liquid-state precursor within the chamber; and
      a temperature sensor configured to detect a temperature of a surface of a liquid-state precursor contained within the source vessel; wherein the temperature sensor comprises a plurality of temperature sensors nonuniformly vertically distributed in a fixed location along a vertical rod disposed within the source vessel, with intervals between adjacent temperature sensors near a bottom portion of the source vessel being smaller than intervals between adjacent temperature sensors near atop portion of the source vessel;
   a heating jacket disposed around the source vessel; and a controller comprising a processor, wherein the processor is configured to communicate with a tangible, non-transitory memory having instructions stored thereon, that, in response to execution by the processor, cause the semiconductor processing system to perform various operations, wherein the various operations comprise:

receiving, by the processor, temperature data from the temperature sensor indicative of the temperature of the surface of the liquid-state precursor;

based on the temperature data, controlling, by the processor, the heating jacket to heat the liquid-state precursor to impart a desired vapor pressure to the liquid-state precursor.

13. The semiconductor processing system of claim 12, wherein the temperature sensor comprises an infrared temperature sensor.

* * * * *